(12) United States Patent
Heo

(10) Patent No.: US 9,053,763 B2
(45) Date of Patent: Jun. 9, 2015

(54) NON-VOLATILE MEMORY DEVICES AND METHODS OF MANUFACTURING THE SAME

(71) Applicant: SK hynix Inc., Icheon-si Gyeonggi-do (KR)

(72) Inventor: Hyun Heo, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 75 days.

(21) Appl. No.: 13/732,512

(22) Filed: Jan. 2, 2013

(65) Prior Publication Data
US 2014/0063978 A1      Mar. 6, 2014

(30) Foreign Application Priority Data

Sep. 4, 2012   (KR) .................. 10-2012-0097782

(51) Int. Cl.
| | |
|---|---|
| *G11C 7/00* | (2006.01) |
| *G11C 7/10* | (2006.01) |
| *H01L 21/28* | (2006.01) |
| *G11C 16/12* | (2006.01) |
| *G11C 13/00* | (2006.01) |

(52) U.S. Cl.
CPC ...... *G11C 7/10* (2013.01); *H01L 21/28* (2013.01); *G11C 7/00* (2013.01); *G11C 13/0069* (2013.01); *G11C 16/12* (2013.01)

(58) Field of Classification Search
CPC ........... G11C 13/0069; G11C 13/0004; G11C 13/0007; G11C 2213/79; G11C 2213/72
USPC .................... 365/148, 185.12, 185.22, 185.05
See application file for complete search history.

(56) References Cited

U.S. PATENT DOCUMENTS

| | | | |
|---|---|---|---|
| 2006/0181928 A1* | 8/2006 | Lee et al. ................. | 365/185.22 |
| 2013/0135930 A1* | 5/2013 | Oh et al. .................. | 365/185.05 |

FOREIGN PATENT DOCUMENTS

| | | |
|---|---|---|
| KR | 1020070075517 A | 7/2007 |
| KR | 100833422 B1 | 5/2008 |

* cited by examiner

*Primary Examiner* — Jason Lappas
(74) *Attorney, Agent, or Firm* — William Park & Associates Ltd.

(57) ABSTRACT

This technology relates to nonvolatile memory devices and methods of manufacturing the same. A nonvolatile memory device can include a memory cell array configured to include a plurality of strings, a page buffer unit connected to the plurality of strings, respectively, and configured to sense data, and a switching unit disposed between the memory cell array and the page buffer unit and configured to comprise a variable resistor.

17 Claims, 7 Drawing Sheets

NON-VOLATILE MEMORY DEVICES AND METHODS OF MANUFACTURING THE SAME

CROSS-REFERENCES TO RELATED APPLICATION

The present application claims priority under 35 U.S.C. §119(a) to Korean application number 10-2012-0097782, filed on Sep. 4, 2012, in the Korean Intellectual Property Office, which is incorporated herein by reference in its entirety.

BACKGROUND

1. Technical Field

The present invention generally relates to nonvolatile memory devices, and more particularly, to nonvolatile memory devices and methods of manufacturing the same.

2. Related Art

Researches are being carried out on the next-generation nonvolatile memory devices which do not require a refresh function in order to comply with a need for the lower power of the memory device. A NAND flash memory device, that is, one of the next-generation memory devices, basically includes a memory cell array and a page buffer.

The memory cell array includes a plurality of cells for storing data, a plurality of bit lines, and a plurality of word lines. The plurality of bit lines is connected to respective page buffer circuits.

The page buffer includes the plurality of page buffer circuits. Each of the page buffer circuits includes a bit line selection unit for selecting any one of an even bit line and an odd bit line and a latch unit for latching I/O data and enabling program or reading.

The bit line selection unit of the page buffer circuit commonly includes four NMOS transistors. Each of the NMOS transistors includes a high voltage transistor which can withstand a high voltage. This is because a high voltage of 20 V or higher is used when the erase operation of a common nonvolatile memory device is performed.

The high voltage transistor has a much larger size than a low voltage transistor because it is fabricated so that it can withstand a high voltage. For this reason, the high voltage transistor functions as a limiting factor in reducing the size of a common nonvolatile memory device.

SUMMARY

Nonvolatile memory devices capable of reducing the size of the devices and methods of manufacturing the same are described herein.

In an embodiment, a nonvolatile memory device may include a memory cell array configured to includes a plurality of strings, a page buffer unit connected to the plurality of strings, respectively, and configured to sense data, and a switching unit disposed between the memory cell array and the page buffer unit and configured to include a variable resistor.

In an embodiment, a nonvolatile memory device may include a memory cell array configured to includes a plurality of strings, a page buffer unit connected to the plurality of strings, respectively, and configured to sense data, a switching unit configured to include a variable resistor for performing a switching operation depending on whether the erase operation of the memory cell array is performed or not, and a page buffer protection unit configured to protect the page buffer unit.

In an embodiment, a method of manufacturing a nonvolatile memory device may include forming an interlayer insulating layer, including a contact hole through which a junction on one side of a memory cell array is opened, over a semiconductor substrate in which a memory cell array is formed, forming a switching unit at a bottom of the contact hole, forming a contact unit over the switching unit so that the contact hole is buried, and forming a bit line over the contact unit.

In an embodiment, a method of manufacturing a nonvolatile memory device may include forming a first interlayer insulating layer, including a first hole through which a junction on one side of a memory cell array is opened, over a semiconductor substrate in which a memory cell array is formed, forming a first contact unit in the first hole, forming a switching unit over the first interlayer insulating layer so that the switching unit is connected to the first contact unit, forming a second interlayer insulating layer over the switching unit and the first interlayer insulating layer, forming a second hole through which the switching unit is exposed over the second interlayer insulating layer, forming a second contact unit in the second hole, and forming a bit line over the second contact unit.

BRIEF DESCRIPTION OF THE DRAWINGS

Features, aspects, and embodiments are described in conjunction with the attached drawings, in which.

DETAILED DESCRIPTION

Hereinafter, a nonvolatile memory device and a method of manufacturing the same according to the various embodiments will be described below with reference to the accompanying drawings through the embodiments.

Figure 1:
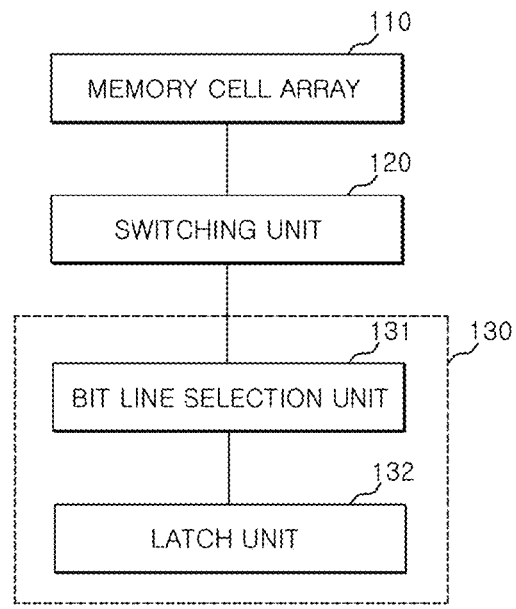
FIG. 1 is a block diagram of a nonvolatile memory device in accordance with an embodiment.
Figure 2:
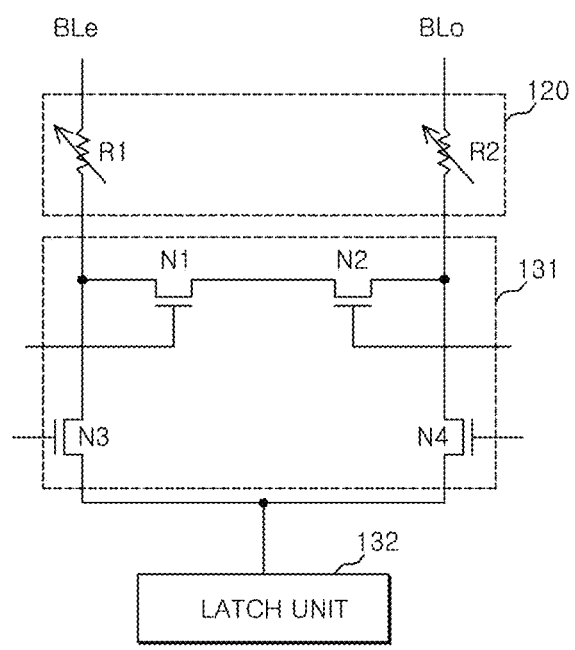
FIG. 2 is a circuit diagram showing a construction of the switching unit and the page buffer of the nonvolatile memory device in accordance with an embodiment.

FIG. 1 is a block diagram of a nonvolatile memory device in accordance with an embodiment, and FIG. 2 is a circuit diagram showing a construction of the switching unit and the page buffer of the nonvolatile memory device in accordance with an embodiment.

Referring to FIGS. 1 and 2, the nonvolatile memory device in accordance with an embodiment can include a memory cell array 110, a switching unit 120, and a page buffer unit 130.

The memory cell array 110 may include a plurality of strings. Each of the strings may include select transistors formed at both ends of memory cells that are coupled in series. Here, a plurality of the strings can be connected to a word line. Each of the strings may be electrically connected to a page buffer for sensing data through a pair of even and odd bit lines BLe and BLo.

The switching unit 120 may be disposed between the memory cell array 110 and the page buffer unit 130. The switching unit 120 may be turned on or off in response to the cell string operation of the nonvolatile memory device. In other words, if an operation of the memory cell array 110 is a program operation or a read operation, an electric current flows through the switching unit 120 in a forward direction because the switching unit 120 is turned on. If an operation of the memory cell array 110 is an erase operation, an electric current does not flow through the switching unit 120 because the switching unit 120 is turned off. That is, when an erase operation is performed, an erase bias of a high voltage can be prevented from being transmitted to a bit line BLe or BLo. The switching unit 120 can include two electrodes, that is, an upper electrode and a lower electrode, and a variable resistance unit placed between the upper electrode and the lower electrode. If the switching unit 120 includes the lower electrode, the variable resistance unit, and the upper electrode as described above, the switching unit 120 can perform a rectifier operation. The variable resistance unit can be formed of any one of a unipolar device or a bipolar device. This is described in detail later.

The page buffer unit 130 can include a plurality of page buffer circuits connected to the plurality of bit lines of the memory cell array 110. Each of the page buffer circuits may include a bit line selection unit 131 and a latch unit 132.

The bit line selection unit 131 may include four NMOS transistors N1~N4. Each of the four NMOS transistors may include a low voltage transistor which can withstand a low voltage. Accordingly, the size of the nonvolatile memory device in accordance with the embodiments can be reduced as compared with the prior art. In general, this is because the switching unit 120 performs control so that an electric current does not flow through the bit line selection unit 131 in an erase operation, that is, an operation that requires a high voltage, and an electric current flows through the bit line selection unit 131 in a program operation or read operation, that is, an operation requiring a low voltage.

The latch unit 132 latches data outputted from a bit line BLe or BLo that is selected by the bit line selection unit 131.

The switching unit 120 of the nonvolatile memory device constructed as described above in accordance with an embodiment is described in detail below. Additionally, the switching unit may include variable resistance units R1 and R2.

Figure 3:
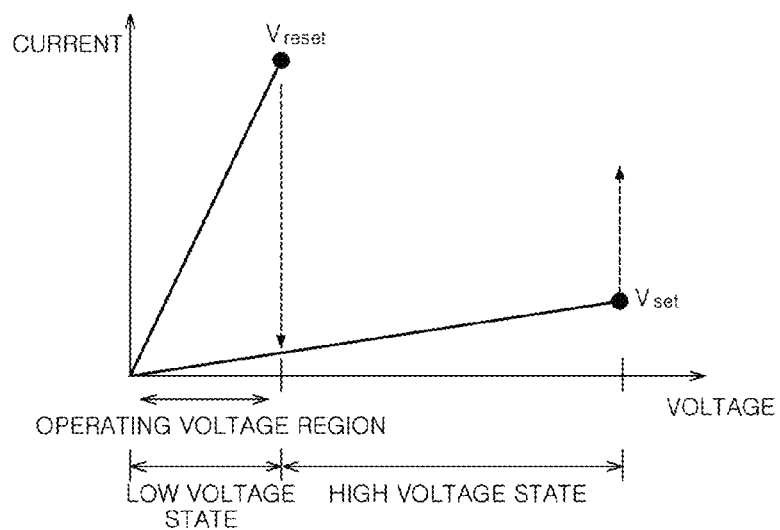
FIG. 3 a diagram showing voltage characteristics when the switching unit of the nonvolatile memory device in accordance with an embodiment includes a unipolar device.
Figure 4:
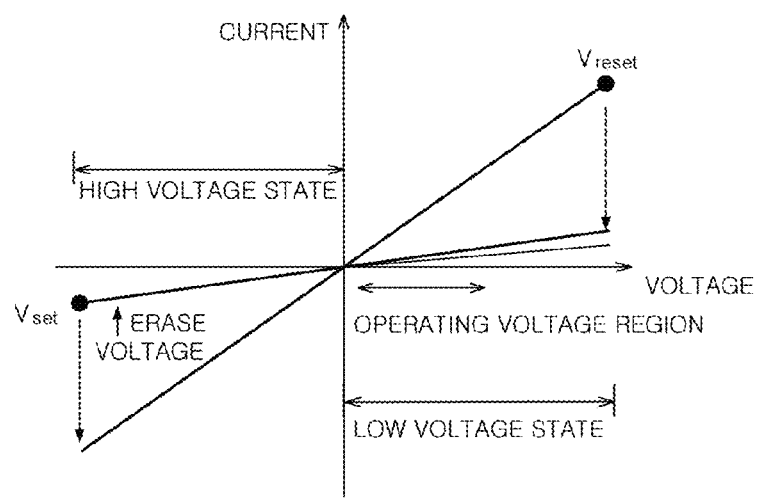
FIG. 4 is a diagram showing voltage characteristics when the switching unit of the nonvolatile memory device in accordance with an embodiment includes a bipolar device.

FIG. 3 a diagram showing voltage characteristics when the switching unit 120 of the nonvolatile memory device in accordance with an embodiment includes a unipolar device, and FIG. 4 is a diagram showing voltage characteristics when the switching unit 120 of the nonvolatile memory device in accordance with an embodiment includes a bipolar device. The x-axis of FIGS. 3 and 4 showing voltage and the y-axis of FIGS. 3 and 4 showing current.

If the variable resistance unit of the switching unit 120 in accordance with an embodiment is formed of a unipolar device, the variable resistance unit shows a low voltage characteristic at a reset voltage $V_{reset}$ or lower, shows a high voltage characteristic when the reset voltage $V_{reset}$ or higher is applied, and shows a low voltage characteristic again when a set voltage $V_{set}$ or higher is applied, as shown in FIG. 3.

If the switching unit 120 of the nonvolatile memory device includes a unipolar device according to the above characteristics, a program or read operation is performed without performing any operation on the bit line selection unit 131 because the program or read operation is performed in a low voltage state. That is, the switching operation of the switching unit 120 is turned on, so voltage supplied by the memory cell array 110 is supplied to the bit line selection unit 131 without change. This is because an operating voltage state is a low voltage state.

Additionally, when an erase operation is performed, the reset voltage $V_{reset}$ or higher is supplied from the memory cell array 110 to the switching unit 120 through the bit line BLe or BLo. Thus, the state of the switching unit 120 is changed into a high voltage state so that the erase operation is performed. When the switching unit 120 becomes a high voltage state as described above, the switching unit 120 does not transfer a high erase voltage, supplied to a well, to peripheral circuits including the bit line selection unit 131. That is, the switching operation of the switching unit 120 is turned off. After the bit line selection unit 131 is changed into the high voltage state as described above so that the erase operation is performed, the set voltage $V_{set}$ or higher is supplied to the bit line again so that the switching unit 120 becomes a low voltage state again. This is because in the nonvolatile memory device, operations other than an erase operation are performed in a low voltage state.

The unipolar device can be embodied by properly controlling material and a composition. Here, the unipolar device made of any one of NiO, MnOx, $ZrO_2$, $(Ba,Sr)TiO_3$, MgZnO, and $HfO_2$ can be used as the variable resistance unit.

Additionally, if the switching unit 120 of the nonvolatile memory device in accordance with an embodiment includes a bipolar device, the state of the variable resistance unit is changed into a high voltage state when a positive voltage equal to or higher than a reset voltage $V_{reset}$ is supplied to the upper electrode in a low voltage state and is then changed into a low voltage state again when a negative voltage equal to or higher than a set voltage $V_{set}$ is supplied to the upper electrode, as shown in FIG. 4.

If the switching unit 120 of the nonvolatile memory device includes a bipolar device, a program or read operation may be performed by forming the reset voltage $V_{reset}$ into an operating voltage or higher. This is because at the operating voltage or higher, the bit line selection unit 131 can be changed into a low voltage state. In contrast, like in the unipolar device, when an erase operation is performed, the reset voltage $V_{reset}$ or higher is supplied to the switching unit 120 the bit line BLe or BLo so that the state of the switching unit 120 is changed into a high voltage state. In the erase operation, the set voltage $V_{reset}$ must be higher than an erase voltage or higher. This is because the positive voltage is supplied to the lower electrode of the switching unit 120. In other words, this is because the state of the bit line selection unit 131 cannot be changed into a high voltage state. Furthermore, after the erase operation is performed, it will be preferred that the state of the bipolar device be changed into a low voltage state again by instantly supplying a positive voltage equal to or higher than an erase voltage to the well of a memory cell. Here, the bipolar device made of any one of NiTiO, CuC, $SrTiO_3$, CuxO, AlOx, $TiO_2$/TiN, and TiOx can be used as the variable resistance unit.

The switching unit 120 in accordance with an embodiment may be formed between two drain contacts or may be formed within a drain contact.

Figure 5:
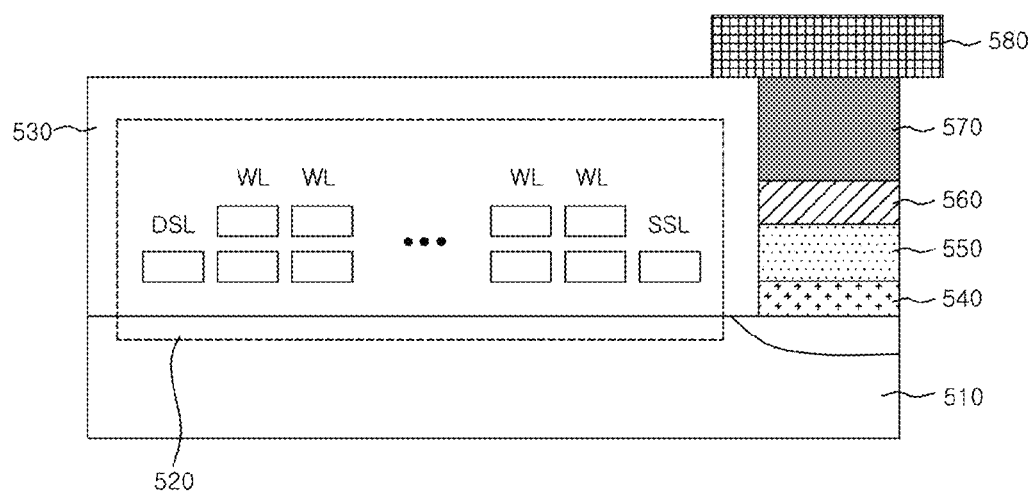
FIGS. 5 and 6 are cross-sectional views of nonvolatile memory devices in accordance with the embodiments.
Figure 6:
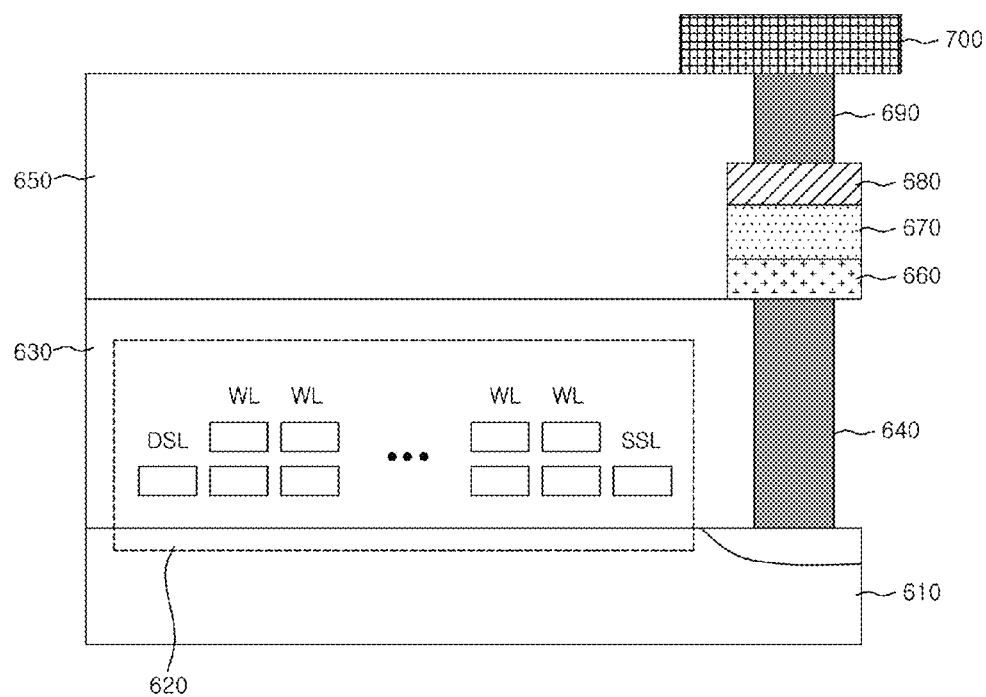

FIGS. 5 and 6 are cross-sectional views of nonvolatile memory devices in accordance with the embodiments.

FIG. 5 shows an example in which the switching unit 120 is formed on the same plane as a memory cell array 520. That is, the memory cell array 520 may be formed over a semiconductor substrate 510. A lower electrode 540, a variable resistance unit 550 formed over the lower electrode 540, an upper electrode 560 formed over the variable resistance unit 550, and a drain contact 570 formed over the upper electrode 560 may be formed in the peripheral region of the memory cell array 520. A bit line 580 may be formed over the drain contact 570 formed as described above. Here, the variable resistance unit 550 can be formed of a unipolar or bipolar device using the material described above. Furthermore, reference numeral 530 denotes an interlayer insulating layer. Also, FIGS. 5 and 6 illustrate drain select lines DSL, word lines WL, and source select lines SSL.

Additionally, FIG. 6 s a cross-sectional view of a nonvolatile memory device in accordance with an embodiment. In the present embodiment, the switching unit 120 (see FIGS. 1 and 2) may be placed in a plane over a memory cell array 620. That is, the memory cell array 620 may be formed over a semiconductor substrate 610. A first drain contact 640, a lower electrode 660 formed over the first drain contact 640, a variable resistance unit 670 formed over the lower electrode 660, an upper electrode 680 formed over the variable resistance unit 670, and a second drain contact 690 formed over the upper electrode 680 are formed in the peripheral region of the memory cell array 620. A bit line 700 may be formed over the second drain contact 690. Here, the variable resistance unit 670 can be formed of a unipolar or bipolar device as described above. Furthermore, reference numerals 630 and 650 denote a first interlayer insulating layer and a second interlayer insulating layer, respectively.

Methods of manufacturing the nonvolatile memory device constructed as described above in accordance with various embodiments are described with reference to FIGS. 7 and 8.

Figure 7:
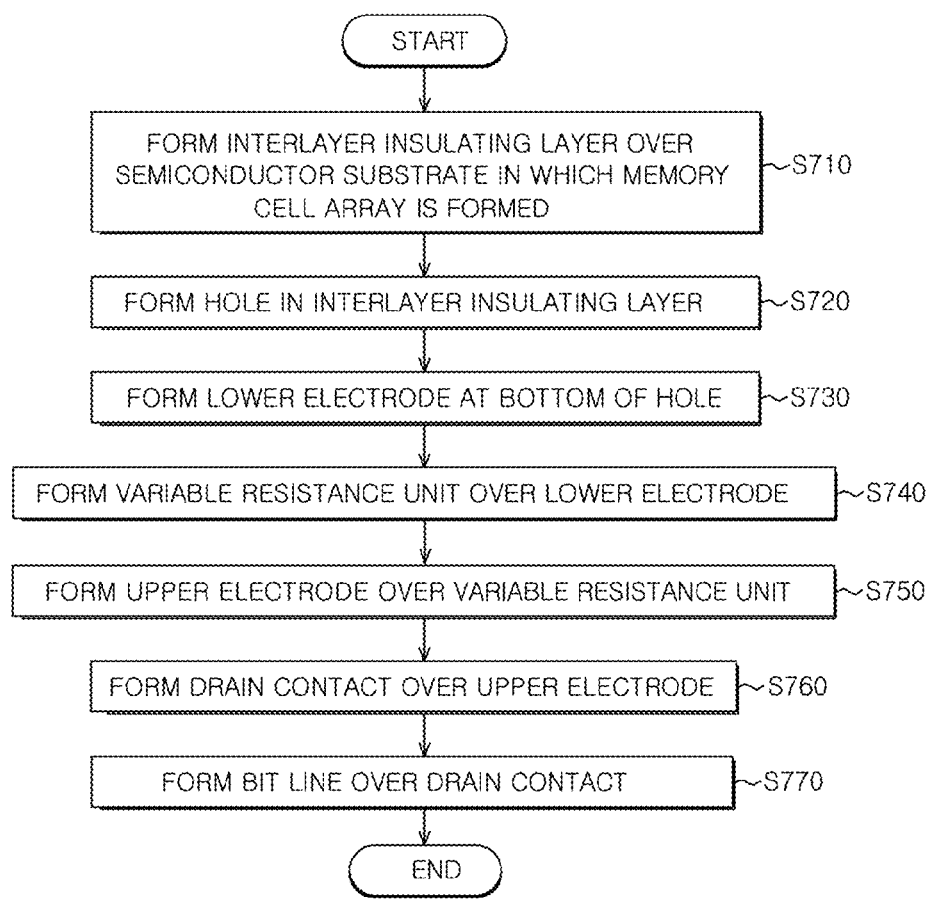
FIGS. 7 and 8 are flowcharts illustrating methods of manufacturing the nonvolatile memory device in accordance with various embodiments.
Figure 8:
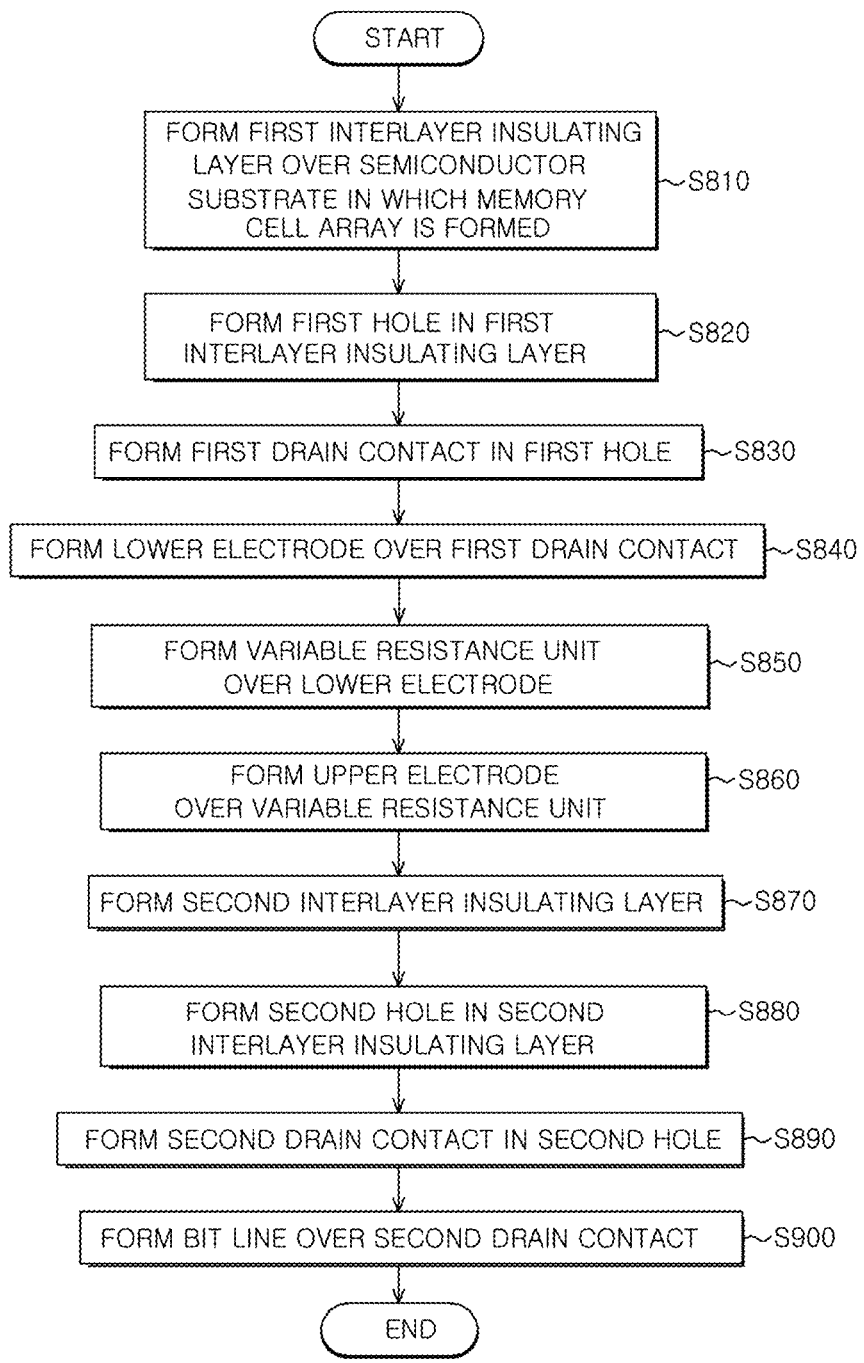

FIGS. 7 and 8 are flowcharts illustrating methods of manufacturing the nonvolatile memory device in accordance with an embodiment.

Referring to FIG. 7, in a method of manufacturing the nonvolatile memory device in accordance with an embodiment, the memory cell array 520 may be formed over the semiconductor substrate 510, and the interlayer insulating layer 530 may be formed over the semiconductor substrate 510 in which the memory cell array 520 is formed at step S710.

Next, a hole configured to open a junction on one side of the memory cell array 520 (see FIG. 5) and to have a kind of drain contact formed therein is formed in the interlayer insulating layer 530 at step S720. The lower electrode 540 may be formed at the bottom of the hole at step S730.

The variable resistance unit 550 may be formed over the lower electrode 540 at step S740. As described above, the variable resistance unit 550 can be formed of a unipolar device or a bipolar device. The unipolar device can be made of any one of NiO, MnOx, $ZrO_2$, (Ba,Sr)$TiO_3$, MgZnO, and $HfO_2$, and the bipolar device can be made of any one of NiTiO, CuC, $SrTiO_3$, CuxO, AlOx, $TiO_2$/TiN, and TiOx.

After forming the upper electrode 560 over the variable resistance unit 550 at step S750, the drain contact 570 is formed over the upper electrode 560 at step S760.

The bit line 580 is formed over the drain contact 570 at step S770.

Additionally, referring to FIG. 8, in a method of manufacturing the nonvolatile memory device in accordance with an embodiment, the memory cell array 620 may be formed over the semiconductor substrate 610, and the first interlayer insulating layer 630 may be formed over the semiconductor substrate 610 in which the memory cell array 620 is formed at step S810.

A first hole for forming the first drain contact 640 may be formed in the first interlayer insulating layer 630 at step S820. The first drain contact 640 may be formed in the first hole at step S830.

The switching unit 120 may be formed over the first drain contact 640 so that the first drain contact 640 may be connected to an upper part of the first interlayer insulating layer 630. More particularly, the lower electrode 660 may be formed over the first drain contact 640 at step S840, the variable resistance unit 670 may be formed over the lower electrode 660 at step S850, and the upper electrode 680 may be formed over the variable resistance unit 670 at step S860. As described above, the variable resistance unit 670 can be formed of a unipolar device or a bipolar device. The unipolar device can be made of any one of NiO, MnOx, $ZrO_2$, (Ba,Sr)$TiO_3$, MgZnO, and $HfO_2$, and the bipolar device can be made of any one of NiTiO, CuC, $SrTiO_3$, CuxO, AlOx, $TiO_2$/TiN, and TiOx.

The second interlayer insulating layer 650 may be formed over the switching unit 120 and the first interlayer insulating layer 630 formed as described above at step S870. A second hole for opening the switching unit 120, that is, the upper electrode 680, may be formed in the second interlayer insulating layer 650 in order to form the second drain contact 690 at step S880. Here, the second hole formed in the second interlayer insulating layer 650 may be formed at a position corresponding to the second drain contact 640.

The second drain contact 690 may be formed in the second hole and formed as described above at step S890. Here, the first drain contact 640 and the second drain contact 690 can be made of low-resistance material, such as tungsten (W).

Next, the bit line 700 may be formed over the second drain contact 690 at step S900.

Figure 9:
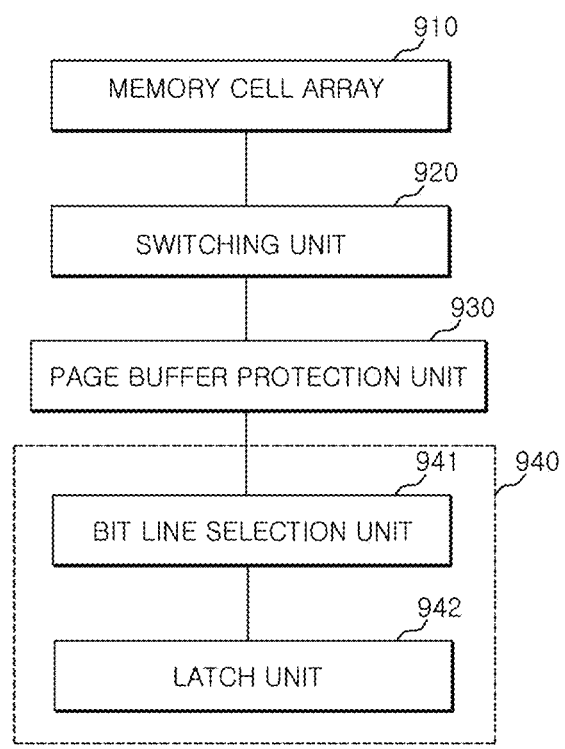
FIG. 9 is a block diagram of a nonvolatile memory device in accordance with an embodiment.

FIG. 9 is a block diagram of a nonvolatile memory device in accordance with an embodiment.

Referring to FIG. 9, the nonvolatile memory device in accordance with an embodiment can include a memory cell array 910, a switching unit 920, a page buffer protection unit 930, and a page buffer unit 940. The page buffer unit 940 can include a bit line selection unit 941 and a latch unit 942.

The memory cell array 910, the switching unit 920, and the page buffer unit 940 that form the nonvolatile memory device in accordance with an embodiment are the same as those described with reference to FIGS. 1 to 8, and a detailed description thereof is omitted.

The page buffer protection unit 930 can be disposed between the switching unit 920 and the page buffer unit 940 when the variable resistance unit of the switching unit 920 is formed of a unipolar device. This is because the page buffer unit 940 formed of a low voltage transistor can be damaged when the state of the variable resistance unit of the switching unit 920 is changed into a low voltage state by a set voltage although it is a short time. The page buffer protection unit 930 can be formed of a resistor or a capacitor.

While various embodiments have been described above, it will be understood to those skilled in the art that the embodiments described are by way of example only. Accordingly, the device and method described herein should not be limited based on the described embodiments.

What is claimed is:
1. A nonvolatile memory device, comprising:
   a memory cell array configured to comprises a plurality of strings;
   a page buffer unit connected to the plurality of strings, respectively, and configured to sense data; and a switching unit disposed between the memory cell array and the page buffer unit and configured to comprise a variable resistor.

2. The nonvolatile memory device according to claim 1, wherein the switching unit comprises:
   a lower electrode;
   a variable resistance unit formed over the lower electrode; and
   an upper electrode formed over the variable resistance unit.

3. The nonvolatile memory device according to claim 2, wherein the variable resistance unit is formed of a unipolar device or a bipolar device.

4. The nonvolatile memory device according to claim 3, wherein the unipolar device has a low voltage characteristic in a reset voltage or lower, has a high voltage characteristic when the reset voltage or higher is applied, and has a low voltage characteristic again with a set voltage or higher.

5. The nonvolatile memory device according to claim 3, wherein a state of the bipolar device is changed into a high voltage state when a positive voltage equal to or higher than a reset voltage is supplied to the upper electrode in a low voltage state and is changed into a low voltage state again when a negative voltage equal to or higher than a set voltage or higher is supplied to the upper electrode.

6. The nonvolatile memory device according to claim 4, wherein the unipolar device is made of any one of NiO, MnOx, $ZrO_2$, (Ba,Sr)$TiO_3$, MgZnO, and $HfO_2$.

7. The nonvolatile memory device according to claim 5, wherein the bipolar device is made of any one of NiTiO, CuC, $SrTiO_3$, CuxO, AlOx, $TiO_2$/TiN, and TiOx.

8. The nonvolatile memory device according to claim 1, wherein the page buffer unit is formed of a low voltage transistor.

9. The nonvolatile memory device according to claim 2, wherein the lower electrode, variable resistance unit, and the upper electrode are formed in a peripheral region of the memory cell array.

10. The nonvolatile memory device according to claim 1, wherein the page buffer unit comprises a bit line selection unit and a latch unit.

11. The nonvolatile memory device according to claim 10, wherein the bit line selection unit comprises NMOS transistors.

12. A method of manufacturing a nonvolatile memory device, comprising:
    forming an interlayer insulating layer, comprising a contact hole through which a junction on one side of a memory cell array is opened, over a semiconductor substrate in which a memory cell array is formed;
    forming a switching unit at a bottom of the contact hole;
    forming a contact unit over the switching unit so that the contact hole is buried; and
    forming a bit line over the contact unit.

13. The method according to claim 12, wherein the forming of a switching unit at a bottom of the contact hole comprises:
    forming a lower electrode at a bottom of the contact hole;
    forming a variable resistance unit over the lower electrode; and
    forming an upper electrode over the variable resistance unit.

14. The method according to claim 13, wherein the variable resistance unit is formed of a unipolar device or a bipolar device.

15. The method according to claim 14, wherein the unipolar device is made of any one of NiO, MnOx, $ZrO_2$, (Ba,Sr)$TiO_3$, MgZnO, and $HfO_2$.

16. The method according to claim 14, wherein the bipolar device is made of any one of NiTiO, CuC, $SrTiO_3$, CuxO, AlOx, $TiO_2$/TiN, and TiOx.

17. The method according to claim 13, wherein the lower electrode, variable resistance unit, and the upper electrode are formed in a peripheral region of the memory cell array.

* * * * *